US009658525B2

(12) United States Patent
Kondou et al.

(10) Patent No.: US 9,658,525 B2
(45) Date of Patent: May 23, 2017

(54) PELLICLE

(71) Applicant: Mitsui Chemicals, Inc., Minato-ku (JP)

(72) Inventors: Masahiro Kondou, Iwakuni (JP); Takamasa Tsumoto, Iwakuni (JP)

(73) Assignee: MITSUI CHEMICALS INC., Tokyo (JP)

( * ) Notice: Subject to any disclaimer, the term of this patent is extended or adjusted under 35 U.S.C. 154(b) by 304 days.

(21) Appl. No.: 14/417,948

(22) PCT Filed: Jul. 31, 2013

(86) PCT No.: PCT/JP2013/004643
§ 371 (c)(1),
(2) Date: Jan. 28, 2015

(87) PCT Pub. No.: WO2014/020912
PCT Pub. Date: Feb. 6, 2014

(65) Prior Publication Data
US 2015/0212404 A1    Jul. 30, 2015

(30) Foreign Application Priority Data

Aug. 2, 2012    (JP) .................................. 2012-171829

(51) Int. Cl.
*G03F 1/64*    (2012.01)
*G03F 1/62*    (2012.01)
*C09J 127/16*    (2006.01)

(52) U.S. Cl.
CPC .............. *G03F 1/64* (2013.01); *C09J 127/16* (2013.01); *G03F 1/62* (2013.01); *Y10T 428/1352* (2015.01)

(58) Field of Classification Search
CPC ..................................... G03F 1/62; G03F 1/64
USPC .............................................................. 430/5
See application file for complete search history.

(56) References Cited

U.S. PATENT DOCUMENTS

| 4,996,106 A | * | 2/1991 | Nakagawa | G03F 1/62 428/14 |
| 6,149,992 A | * | 11/2000 | Nakayama | G03F 1/64 428/14 |
| 6,824,930 B1 | * | 11/2004 | Wheland | C08F 214/18 359/350 |
| 6,875,819 B2 | * | 4/2005 | Sunaga | C08G 61/08 430/4 |
| 7,438,995 B2 | * | 10/2008 | French | G03F 1/62 355/18 |
| 2011/0129766 A1 | | 6/2011 | Shirasaki et al. | |

FOREIGN PATENT DOCUMENTS

| EP | 0 622 680 A2 | 11/1994 |
| JP | 01-120555 A | 5/1989 |
| JP | 04-237055 A | 8/1992 |
| JP | 06-301199 A | 10/1994 |
| JP | 2001-222100 A | 8/2001 |
| JP | 2002-202587 A | 7/2002 |
| JP | 2002-318451 A | 10/2002 |
| JP | 2005-140887 A | 6/2005 |
| JP | 2010-102357 A | 5/2010 |
| JP | 2011-118091 A | 6/2011 |
| JP | 2012-063503 A | 3/2012 |
| JP | 2012-093518 A | 5/2012 |
| KR | 10-0327184 B1 | 11/2002 |
| WO | WO 98/22851 A1 | 5/1998 |

OTHER PUBLICATIONS

International Search Report (PCT/ISA/210) mailed on Sep. 10, 2013, by the Japanese Patent Office as the International Searching Authority for International Application No. PCT/JP2013/004643.

\* cited by examiner

*Primary Examiner* — Christopher Young
(74) *Attorney, Agent, or Firm* — Buchanan, Ingersoll & Rooney PC

(57) ABSTRACT

The purpose of the present invention is to provide a pellicle which has, on the inner surface of the pellicle frame, a pressure-sensitive adhesive layer that has holding performance capable of satisfactorily adhering suspended substances including dust thereto and that has excellent resistance to short-wavelength light. This pellicle comprises a pellicle frame, a pellicle film stretched over the pellicle frame, and a pressure-sensitive adhesive layer disposed inside the pellicle frame, wherein the pressure-sensitive adhesive layer comprises a copolymer having structural units represented by formula (1) and structural units represented by formula (2), the amount of the copolymer being 60 mass % or more of the pressure-sensitive adhesive layer.

$$-CH_2CF_2- \qquad (1)$$

$$-CF_2CF(CF_3)- \qquad (2)$$

6 Claims, 5 Drawing Sheets

PELLICLE

TECHNICAL FIELD

The present invention relates to a pellicle used for protecting a lithography mask from dust in the lithography process for semiconductor devices, such as LSIs and VLSIs, liquid crystal display panels, and the like.

BACKGROUND ART

In the lithography process for semiconductor devices, such as LSIs and VLSIs, liquid crystal display panels, and the like, a pellicle is mounted on a lithography mask for preventing possible attachment of foreign substance to the mask. A pellicle generally includes: a pellicle frame; a transparent pellicle membrane stretched over the upper end surface of the pellicle frame; a mask adhesive layer provided on the lower end surface of the pellicle frame for sticking the pellicle to a musk; and a tacky layer provided on the inner surface of the pellicle frame.

The tacky layer provided on the inner surface of the pellicle frame not only prevents generation of dust from the pellicle frame but also can hold foreign substance, such as dust suspended in the space inside the pellicle frame. Therefore, the tacky layer is effective for avoiding possible attachment of foreign substance to the mask.

In recent years, reduction in the wavelength of exposure light has advanced with the miniaturization of mask patterns. Examples of short-wavelength light include excimer light, such as KrF excimer laser and ArF excimer laser.

FIG. 5 is a schematic diagram showing an example of a pellicle mounted on a mask. As shown in FIG. 5, exposure light generally passes through a portion other than light-blocking pattern 9 of mask 5 and is incident generally parallel to the normal line of pellicle membrane 1 (refer to a thick solid line arrow and a dotted line arrow in the drawing). Therefore, the exposure light does not directly hit tacky layer 8 on the inner surface of pellicle frame 3. However, a part of the exposure light may be scattered at the end (edge) of light-blocking pattern 9 of the mask, and the scattered light may hit tacky layer 8 on the inner surface of pellicle frame 3 (refer to thin solid line arrows in the drawing). In recent years, the exposure light may be allowed to be incident obliquely to the normal line of pellicle membrane 1 (not shown). Therefore, the influence of the scattered exposure light on the tacky layer has increased.

In the tacky layer provided on the inner surface of a conventional pellicle frame, degradations, such as burning, evaporation, solidification and/or mobilization may occur when short-wavelength light having high energy as described above hits the tacky layer.

Moreover, in the lithography using ArF excimer laser light, when a pellicle is used for a long period of time, solid foreign substance may be deposited (haze may occur) on a mask within a space surrounded by the pellicle frame. A possible mechanism of the deposition of solid foreign substance will now be described. If the scattered exposure light or the like hits the tacky layer provided on the inner surface of the pellicle frame, substances in the tacky layer will decompose, and the resulting outgas components (decomposed gas such as ions and organic gases) will be released to a space surrounded by the pellicle frame. Then, the released outgas components will undergo a chemical reaction caused by ArF excimer laser light resulting in deposition of solid foreign substance. It is therefore required for the tacky layer provided on the inner surface of the pellicle frame not to generate decomposed gas even if the tacky layer is irradiated with scattered light of ArF excimer laser light or the like and thereby to prevent deposition of solid foreign substance.

Therefore, it has been required in the art that the tacky layer provided on the inner surface of the pellicle frame have excellent holding performance (tackiness) that allows for satisfactory fixation of suspended dust and the like to the tacky layer, and excellent light resistance to the short-wavelength light such as excimer light so as not to cause the above-described degradations or deposition of solid foreign substance.

There are also proposed a pellicle having a tacky layer containing, for example, a perfluoropolyether and a viscosity controlling agent on the inner surface of a pellicle frame (PTL 1); a pellicle having a tacky layer containing a fluororubber (PTL 3); a pellicle having a tacky layer containing fluororesin grease (A) and a high-molecular weight fluororesin (B) (PTL 4); and the like. Moreover, in order to increase the light resistance to an ArF excimer laser, there are proposed a pellicle having a tacky layer made of a cured product of a composition containing a perfluoro compound on the inner surface of the pellicle frame (PTL 2); and the like.

CITATION LIST

Patent Literature

PTL 1
Japanese Patent Application Laid-Open No. 2001-222100
PTL 2
Japanese Patent Application Laid-Open No. 2011-118091
PTL 3
Japanese Patent Application Laid-Open No. 2002-202587
PTL 4
International Publication No. WO98/22851

SUMMARY OF INVENTION

Technical Problem

However, the tacky layers provided on the inner surface of the pellicle frame of PTLS 1 and 4 are obtained by blending a plurality of tacky materials. Therefore, phase separation may occur between the plurality of tacky materials, and if phase separation occurs, an effect of blending the plurality of tacky materials may not be obtained.

Moreover, the tacky layer provided on the inner surface of the pellicle frame of PTL 2 had insufficient tackiness. On the other hand, the tacky layer provided on the inner surface of the pellicle frame of PTL 3 has satisfactory tackiness, but higher light resistance has been demanded.

The present invention has been made in light of the above circumstances, and an object of the present invention is to provide a pellicle including, on the inner surface of the pellicle frame, a tacky layer that has excellent holding performance that allows for satisfactory fixation of foreign substance such as suspended dust to the tacky layer, and excellent light resistance to short-wavelength light.

Solution to Problem

[1] A pellicle including: a pellicle frame; a pellicle membrane stretched over one opening of the pellicle frame; and a tacky layer provided on an inner surface of the pellicle frame, in which the tacky layer contains a copolymer having a structural unit represented by Formula (1) and a structural unit represented by Formula (2), in an amount of 60mass % or more with respect to a total weight of the tacky layer.

$$—CH_2CF_2— \quad (1)$$

$$—CF_2CF(CF_3)— \quad (2)$$

[2] The pellicle according to [1], in which a content of the structural unit represented by Formula (1) in the copolymer is 50mass % or more and 85mass % or less with respect to the total mass of the copolymer.

[3] The pellicle according to [1] or [2], in which a weight average molecular weight of the copolymer is 80,000 or more and 160,000 or less.

[4] The pellicle according to any one of [1] to [3], in which a fluorine content of the copolymer is 64mass % or more and 71mass % or less with respect to a total mass of the copolymer.

[5] The pellicle according to any one of [1] to [4], in which the copolymer further contains a structural unit represented by Formula (3).

$$—CF_2CF_2— \quad (3)$$

[6] The pellicle according to any one of [1] to [5], in which a thickness of the tacky layer is 3 to 20 µm.

Advantageous Effects of Invention

The present invention can provide a pellicle having on the inner surface of the pellicle frame a tacky layer having holding performance that allows for satisfactory fixation of foreign substance such as suspended dust to the tacky layer and having excellent light resistance to short-wavelength light such as excimer light. Thus, the present invention can provide a pellicle that generates less decomposed gas and that has excellent dustproofness.

DESCRIPTION OF EMBODIMENTS

1. Pellicle

A pellicle of the present invention includes a pellicle frame, a pellicle membrane stretched over one opening of the pellicle frame, and a tacky layer provided on an inner surface of the pellicle frame.

Figure 1:
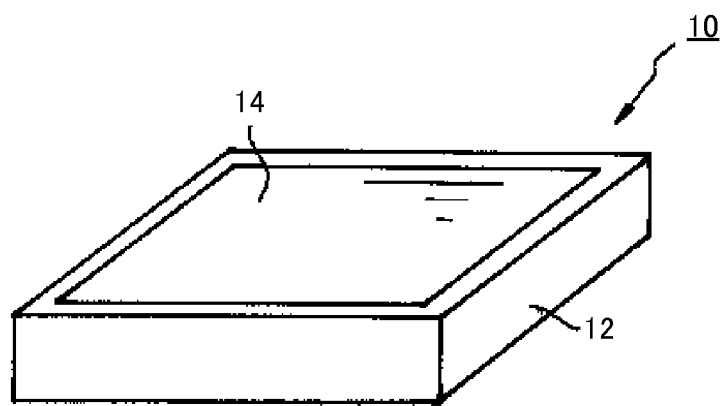
FIG. 1 is a perspective view of a pellicle according to an embodiment of the present invention.
Figure 2:
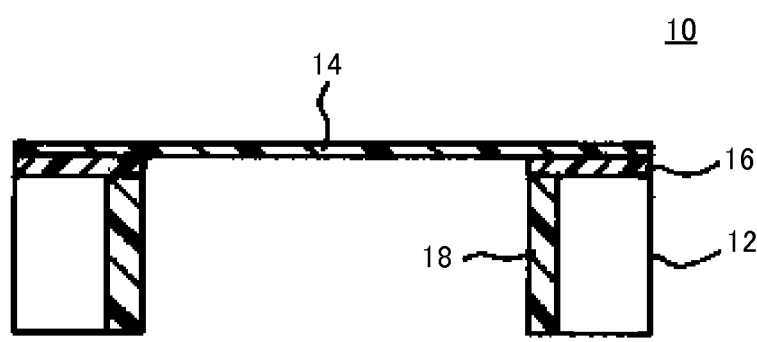
FIG. 2 is a sectional side elevation of a pellicle according to an embodiment of the present invention.

FIG. 1 is a perspective view of a pellicle according to an embodiment of the present invention; and FIG. 2 is a sectional side elevation of a pellicle according to an embodiment of the present invention. As shown in FIGS. 1 and 2, pellicle 10 according to an embodiment of the present invention includes pellicle frame 12, pellicle membrane 14 stretched over one opening of pellicle frame 12, adhesive layer 16 for fixing pellicle membrane 14 to pellicle frame 12, and tacky layer 18 provided on the inner surface of pellicle frame 12.

Pellicle frame 12 may be a commonly-used pellicle frame. Examples of the material of pellicle frame 12 include aluminum alloys, stainless steel, polyethylene, and black anodized aluminum, with aluminum alloys, black anodized aluminum or the like being preferred because of light weight and the like. The surface of pellicle frame 12 on which tacky layer 18 is provided may be further coated with an amorphous fluorine polymer or the like.

Pellicle membrane 14 is fixed to one opening of pellicle frame 12 through adhesive layer 16. Pellicle membrane 14 may be those generally used as a pellicle membrane. Examples of the material of pellicle membrane 14 include nitrocellulose, ethylcellulose, cellulose acetate, cellulose propionate, pullulan compounds, amorphous fluorine polymers, and silicone-modified polyvinyl alcohols. Among them, preferred are amorphous fluorine polymers having sufficient resistance to excimer light.

Tacky layer 18 is provided on the inner surface of pellicle frame 12. Tacky layer 18 is requested to have satisfactory tackiness in order to sufficiently hold dust and the like suspended in a space surrounded by pellicle frame 12. In a lithography process, if light scattered by the edge of a mask pattern or the like hits tacky layer 18, decomposed gas will be generated from tacky layer 18, and the decomposed gas components will probably be present in a space surrounded by pellicle frame 12. The decomposed gas components present in a space surrounded by pellicle frame 12 would undergo a chemical reaction by exposure light, so that deposit solid foreign substance is deposited on a mask or the like. In order to suppress such deposition of solid foreign substance, it is demanded that even if light hits tacky layer 18, little decomposed gas is generated; that is, tacky layer 18 has high light resistance.

Thus, in the present invention, tacky layer 18 contains as a tacky material a copolymer having a structural unit represented by Formula (1) and a structural unit represented by Formula (2).

$$—CH_2CF_2— \quad (1)$$

$$—CF_2CF(CF_3)— \quad (2)$$

The structural unit represented by Formula (1) can impart rubber elasticity to the copolymer to develop sufficient adhesion. Further, the structural unit represented by Formula (2) can stabilize the molecular structure of the copolymer to thereby improve light resistance of the copolymer.

For example, when a polymer having a structural unit represented by Formula (1) and a polymer having a structural unit represented by Formula (2) are simply mixed, phase separation may occur between the polymers. Therefore, the resulting tacky layer may not show sufficient tackiness and light resistance. On the other hand, since a copolymer having a structural unit represented by Formula (1) and a structural unit represented by Formula (2) is used in the present invention, it is considered that the phase separation as described above is less likely to occur. Therefore, it is considered that tacky layer 18 containing the copolymer has sufficient tackiness and light resistance.

The content of the structural unit represented by Formula (1) in the copolymer is preferably 50mass % or more and 85mass % or less, more preferably 55mass % or more and 80mass % or less with respect to the total mass of the copolymer. When the content of the structural unit represented by Formula (1) is at a certain level or higher, sufficient tackiness can be more easily obtained. On the other hand, when the content of the structural unit represented by Formula (1) is at a certain level or lower, significant impairment of light resistance may not occur.

The content of the structural unit represented by Formula (2) in the copolymer is preferably 15mass % or more and 50mass % or less, more preferably 20mass % or more and 45mass % or less with respect to the total mass of the copolymer. When the content of the structural unit represented by Formula (2) is at a certain level or higher, sufficient light resistance is more easily obtained. On the other hand, when the content of the structural unit represented by Formula (2) is at a certain level or lower, significant impairment of tackiness may not occur.

The copolymer may further include other structural units in addition to the structural unit represented by Formula (1) or (2). Preferred examples of other structural units include a structural unit represented by Formula (3). It is considered that the structural unit represented by Formula (3) can impart light resistance to the copolymer.

$$—CF_2CF_2— \quad (3)$$

The content of the structural unit represented by Formula (3) in the copolymer may be 25mass % or less with respect to the total mass of the copolymer, The copolymer is preferably a copolymer (1,1-difluoro-ethylene-hexafluoropropylene copolymer) consisting of a structural unit represented by Formula (1) and a structural unit represented by Formula (2), or a copolymer consisting of a structural unit represented by Formula (1), a structural unit represented by Formula (2), and a structural unit represented by Formula (3); and the copolymer consisting of a structural unit represented by Formula (1) and a structural unit represented by Formula (2) is more preferred. Examples of commercially available products include Viton (trade name; Dupont Elastomer Co., Ltd.).

The fluorine content of the copolymer is preferably 64mass % or more and 71mass % or less with respect to the total mass of the copolymer. When the fluorine content in the copolymer is at a certain level or higher, the light resistance of tacky layer 18 can be further increased. When the fluorine content in the copolymer is at a certain level or lower, the tackiness of tacky layer 18 may not be significantly impaired. The fluorine content in the copolymer can be checked by collecting a gas generated when the copolymer is subjected to combustion decomposition; and measuring the fluorine content in the collected gas by ion chromatography. As a fluorine content meter, ICS-1500 type manufactured by Dionex Corp. can be used.

The weight average molecular weight of the copolymer is preferably 80,000 or more and 160,000 or less, more preferably 100,000 or more and 160,000 or less, further preferably 140,000 or more and 155,000 or less. Tacky layer 18 can be formed by applying a coating liquid for tacky layers to the inner surface of pellicle frame 12, as will be described below. The coating liquid for tacky layers may be prepared by dissolving the copolymer in solvent. When the weight average molecular weight of the copolymer is within the above range, the copolymer can be more easily dissolved in solvent. Therefore, the viscosity of the resulting coating liquid can be easily controlled to a range suitable for coating. Further, it is considered that since the coating liquid for tacky layers containing the copolymer has satisfactory wettability, the liquid can be more easily applied to provide a uniform thickness. Furthermore, when the weight average molecular weight of the copolymer is at a certain level or higher, satisfactory light resistance can be more easily obtained; and when the weight average molecular weight of the copolymer is at a certain level or lower, significant impairment of tackiness may not occur.

The weight average molecular weight of the copolymer can be measured by gel permeation chromatography (GPC) using polystyrene as a standard reference material.

The content of the copolymer in tacky layer 18 is, but not particularly limited to, preferably 60mass % or more, more preferably 80mass % or more, in order to provide sufficient tackiness and light resistance.

Tacky layer 18 may optionally also contain other components in addition to the copolymer. Examples of other components other than the copolymer may be a compound that generates less outgas and has satisfactory light resistance, including perfluoro polyether.

The thickness of tacky layer 18 may be, but is not particularly limited to, a thickness that can sufficiently hold suspended foreign substance by tackiness, and generally, the thickness is preferably 1 μm to 1 mm, more preferably 3 μm to 100 μm, further preferably 3 μm to 20 p.m.

Figure 3:
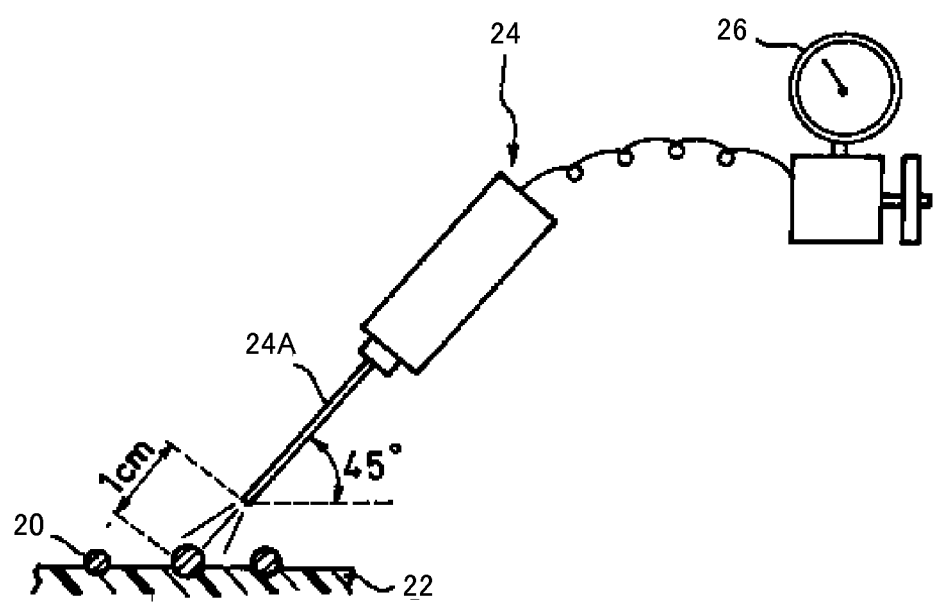
FIG. 3 is a schematic diagram showing a test of the holding performance of a tacky layer according to an embodiment of the present invention.

The foreign substance-holding performance (tackiness) of tacky layer 18 can be evaluated, for example, by the method described below. FIG. 3 is a schematic diagram showing an example of test methods of the holding performance of a tacky layer.

1) A coating liquid for tacky layers is applied to a substrate and then dried to form a tacky layer having a thickness of 10 μm. The substrate may be, but is not particularly limited to, a glass substrate, a pellicle frame, or the like.
2) Next, standard particles are placed on the surface of the resulting tacky layer. The standard particles are those imitating foreign substance such as dust, and may be, for example, glass beads, polystyrene beads, and the like, having a particle size of 66 to 125 μm.
3) Then, as shown in FIG. 3, air is applied by air gun 24 to tacky layer 22, in which standard particles 20 are held, from the direction inclined by 45° to the surface of the tacky layer. Then, the movement of standard particles 20 when air is applied is measured.
4) The operation of step 3) is performed while increasing the air source pressure in the range of 0.1 to 3.0 kg/cm²G. Then, the maximum value of the air source pressure at which the movement of standard particles 20 is less than 1 mm is defined as "foreign substance-holding power."

As shown in FIG. 3, the tip of nozzle 24A of air gun 24 is preferably set at a position separated from standard particles 20 by a straight line distance of 1 cm. For example, the air source pressure being 0.6 kg/cm²G means that the pressure of air emitted from nozzle 24A is 0.6 kg/cm²G, which actually is the pressure of air when the pressure of pressure reducer 26 is set to 0.6 kg/cm²G.

In tacky layer 18, the maximum value of the air source pressure at which the movement of standard particles 20 is less than 1 mm when polystyrene beads having a particle size of 66 μm are used as standard particles 20 is preferably $2.0 \times 10^{-1}$ MPa or more, more preferably $2.5 \times 10^{-1}$ MPa or more.

2. Method for Producing Pellicle

Pellicle 10 according to an embodiment of the present invention can be obtained through 1) foaming tacky layer 18 on the inner surface of pellicle frame 12 and 2) stretching pellicle membrane 14 over one opening of pellicle frame 12.

Step 1)

First, the copolymer, a tacky material, is dissolved in a solvent to provide a coating liquid for tacky layers. The solvent to be used may be, but is not particularly limited to, those that can dissolve the copolymer and can be satisfactorily applied to the inner surface of pellicle frame 12. Examples of such solvent include ketones, such as methyl ethyl ketone, and esters. The blending ratio of the copolymer as a tacky material to a solvent is preferably set so as to satisfy the range of the viscosity to be described below.

It is difficult to apply the coating liquid for tacky layers uniformly when the coating liquid has excessively high viscosity. Therefore, the viscosity at 23° C. of the coating liquid for tacky layers containing about 5 to 40mass % of the copolymer, a tacky material, in the liquid is preferably about 10 cP to 820 cP (about $1\times10^{-2}$ Pa·s to $82\times10^{-2}$ Pa·s). The viscosity of the coating liquid can be measured with an E-type viscometer.

The resulting coating liquid for tacky layers is applied to the inner surface of pellicle frame 12 and then dried to font tacky layer 18.

The application of the coating liquid for tacky layers can be performed using any application techniques, including spray coating, dipping coating method, brush coating, spatula coating, roller coating, and casting coating. In the casting coating method, for example, droplets can be dropped onto the surface of pellicle frame 12 and then extended with a jig to form a coating having a uniform thickness.

Step 2)

After tacky layer. 18 is formed, pellicle membrane 14 can be stretched over one opening of pellicle frame 12 to provide pellicle 10. The stretching of pellicle membrane 14 can be performed by common methods. For example, a commonly-used adhesive may be applied to one end surface of pellicle frame 12 to form adhesive layer 16, and pellicle membrane 14 may be fixed to adhesive layer 16.

The adhesive may be any of the adhesives known in the art, including cellulose derivatives, chlorinated polypropylene, polyamide adhesives, fluororesin adhesives, acrylic adhesives, epoxy resins, and polyimide adhesives.

3. Applications of Pellicle

The pellicle obtained in the manner described is mounted on a mask (not shown) through a mask adhesive layer (not shown) provided on the bottom end of pellicle frame 12. Thereby, possible attachment of foreign substance to the mask (not shown) can be avoided. When the exposure light is focused on foreign substance attached on the mask, poor resolution of the mask patterns on a wafer is caused. Thus, pellicle 10 is mounted in such a way as to cover the exposure area of a mask (not shown).

The mask (not shown) is, for example, a glass substrate with a patterned light-blocking film. The light-blocking film may be a film made of metal such as Cr or MoSi.

Then, exposure light is incident from portions other than the light-blocking film of the mask and passes through pellicle membrane 14. The exposure light is incident generally parallel to the normal line of pellicle membrane 14, but it may be incident in a oblique direction to the normal line of pellicle membrane 14.

Exposure light used for lithography in a circuit pattern-forming step or the like in which circuit patterns are drawn on semiconductor devices may be Hg lamp i-line (wavelength: 365 nm), excimer light having a short wavelength such as KrF excimer laser (wavelength: 248 nm) and ArF excimer laser (wavelength: 193 nm), or the like.

As described above, tacky layer 18 contains the copolymer as a tacky material. Therefore, tacky layer 18 obtained in the present invention may have satisfactory tackiness and satisfactory light resistance to the short-wavelength light such as excimer light.

Therefore, foreign substance such as dust suspended in a space surrounded by pellicle 10 and a mask (not shown) can be satisfactorily held by tacky layer 18 by mounting pellicle 10 on the mask (not shown) on which patterns are provided. Further, the short-wavelength light such as excimer light is scattered at the end (edge) of a light-blocking pattern of the mask or obliquely incident, so that the light easily hits tacky layer 18. Even in such a case, tacky layer 18 is less likely to generate decomposed gas and can suppress deposition or the like of solid foreign substance on the mask.

EXAMPLES

Hereinafter, the present invention will be described in detail with reference to Examples, which however shall not be construed as limiting the scope of the present invention.

Example 1

Viton-A100 (trade name, manufactured by Dupont Elastomer Co., Ltd., 1,1-difluoroethylene-hexafluoropropylene copolymer, the content of the structural unit of —$(CH_2CF_2)$—: 78mass %, the content of the structural unit of —$[CF_2CF(CF_3)]$—: 22mass %, weight average molecular weight: 145,000, fluorine content: 66mass %) was prepared. Then, Viton-A100 was added to solvent methyl ethyl ketone (manufactured by Wako Pure Chemical Industries, Ltd., special grade chemical) such that the content of Viton-A100 was 30 wt % with respect to the total solution, followed by stirring the solution to dissolve the copolymer. The resulting solution was filtered through a filter (pore size: 3 μm) made of polytetrafluoroethylene (PTFE) to remove insolubles and foreign substance, thus obtaining a coating liquid for tacky layers. The viscosity at 23° C. of the coating liquid for tacky layers was 170 cP.

1) Evaluation of Foreign Substance-Holding Power

The resulting coating liquid for tacky layers was applied to the inner surface of the pellicle frame made of an aluminum alloy by dropping the coating liquid from a discharge port (horizontal hollow; inner diameter=0.5 mm) of a 1.5 mm outer diameter needle while uniformly extending the droplets. Then, the resulting coating film was dried to form a tacky layer having a thickness of 10 μm. The content of the copolymer in the tacky layer was 100mass %.

The resulting tacky layer was evaluated for the foreign substance-holding power by performing Evaluations A to C.

(1-1) Evaluation A of Foreign Substance-Holding Power

Glass standard particles having a particle size of 105 to 125 μm were attached to the tacky layer provided on the inner surface of the pellicle frame to provide a sample. Next, the resulting sample was dropped from a height of 1 in, and fall of the attached standard particles was checked by visual observation to evaluate the foreign substance-holding power of the tacky layer.

Fall of standard particles was not observed for the sample obtained in Example 1.

(1-2) Evaluation B of Foreign Substance-Holding Power

Polystyrene standard particles having a particle size of 66 μm were attached to the tacky layer provided on the inner surface of the pellicle frame using horsehair to provide a sample. Next, the movement of the standard particles was measured when air was blown for 10 seconds by an air gun at an angle inclined by 45 degrees to the surface of the tacky layer from a position separated from the standard particles on the tacky layer of the sample by a straight line distance of 1 cm (refer to FIG. 3). The air blow was performed by increasing the air source pressure in steps in the range of 0.1 to 3.0 kg/cm$^2$G ($0.981 \times 10^{-2}$ to $2.94 \times 10^{-1}$ MPa). Then, the maximum value of the air source pressure at which the movement of the standard particles by the air blow is less than 1 mm was defined as "foreign substance-holding power."

Moreover, waviness by air blow was checked by visual observation. Waviness by air blow refers to a phenomenon in which the surface of the tacky layer at a portion to which air has been blown undergoes shape changes, such as waviness and/or depression.

For the sample obtained in Example 1, neither the movement of the standard particles nor waviness by air blow was observed even when the air source pressure was 3.0 kg/cm$^2$G ($2.94 \times 10^{-1}$ MPa).

(1-3) Evaluation C of Foreign Substance-Holding Power

Foreign substance-holding power was evaluated in the same manner as in Evaluation B except that the particle size of polystyrene standard particles was set to 92 μm.

For three samples among the five samples obtained in Example 1, the movement of the standard particles was not observed even when the air source pressure was 2.0 kg/cm$^2$G ($1.96 \times 10^{-1}$ MPa). On the other hand, for the remaining two samples, a slight movement (less than 1 mm) of the standard particles was observed when the air source pressure was 2.0 kg/cm$^2$G ($1.96 \times 10^{-1}$ MPa). For all the five samples, waviness by air blow was not observed even when air source pressure was 2.0 kg/cm$^2$G ($1.96 \times 10^{-1}$ MPa).

(2) Evaluation of Light Resistance

The coating liquid for tacky layers was applied to a quartz glass plate and dried to provide a tacky layer having a thickness of 30 μm. The content of the copolymer in the tacky layer was 100mass %. Then, the light resistance of the resulting tacky layer was evaluated by the following method.

(2-1) Infrared Absorption Spectrum
1) First, an infrared absorption spectrum of the tacky layer before light irradiation was measured using FT-IR6000 manufactured by Jasco Corp.
2) Next, the tacky layer was directly irradiated with ArF excimer laser light having a wavelength of 193 nm in an air atmosphere using L5837 manufactured by Hamamatsu Photonics K.K. Irradiation conditions were set to a frequency of 500 Hz, an energy density of 1 (mJ/cm$^2$)/pulse, and an exposure dose of 500 or 1,000 (J/cm$^2$).
3) Next, an infrared absorption spectrum of the tacky layer after light irradiation was measured in the same manner as described above.
4) Then, the infrared absorption spectra before and after light irradiation were compared. In the infrared absorption spectrum after light irradiation, formation of a new absorption peak and the disappearance of an absorption peak (particularly, an absorption peak at a wavelength of 1,350 to 1,120 cm$^{-1}$) was checked to thereby check changes in the chemical structure of the resin contained in the tacky layer.

Figure 4:
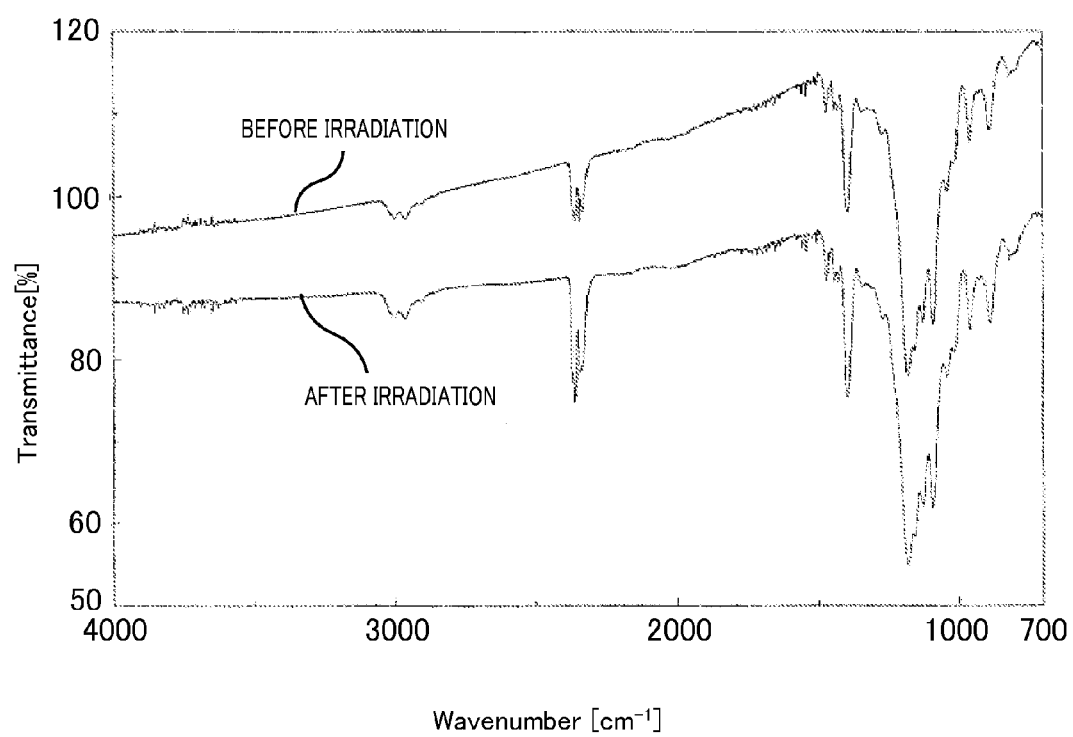
FIG. 4 shows infrared absorption spectra before and after light irradiation of the tacky layer of Example 1.
Figure 5:
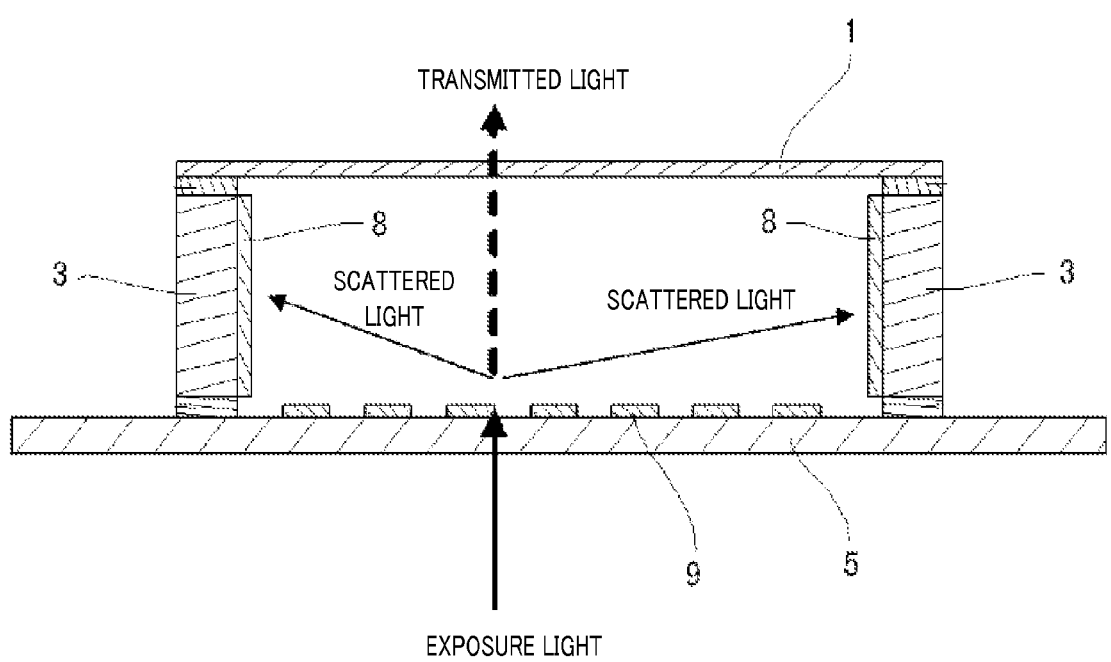
FIG. 5 is a schematic diagram showing an example of a pellicle mounted on a mask.

The results of the measurement of the infrared absorption spectra before and after the light irradiation of the tacky layer of Example 1 are shown in FIG. 4. As shown in FIG. 4, when compared to the infrared absorption spectrum before light irradiation of the tacky layer obtained in Example 1, neither the formation of a new absorption peak nor the disappearance of an absorption peak was observed in the infrared absorption spectrum of the tacky layer after light irradiation.

(2-2) Gas Chromatography Mass Spectrometry (GCMS)

The resulting tacky layer was directly irradiated with ArF excimer laser light having a wavelength of 193 nm in an air atmosphere using L5837 manufactured by Hamamatsu Photonics K.K. Irradiation conditions were set to a frequency of 500 Hz, an energy density of 1 (mJ/cm$^2$)/pulse, and an exposure dose of 500 or 1,000 (J/cm$^2$).

Then, the total amount of outgas (such as lower hydrocarbon) from the part irradiated with ArF excimer laser light and the part not irradiated with ArF excimer laser light of the tacky layer after light irradiation was measured under the following conditions using a gas chromatography-mass spectrometry (GC-MS) meter (manufactured by Shimadzu Corporation, model: GCMS-QP2010).

Gas collecting conditions: heating at 150° C. for 30 minutes

As a result, the amount of outgas from the non-irradiated part was 2.1 ppm, and the amount of outgas from the irradiated part was 7.1 ppm at an exposure dose of 500 (J/cm$^2$) and 15.1 ppm at an exposure dose of 1,000 (J/cm$^2$).

Comparative Example 1

A coating liquid for tacky layers was obtained in the same manner as in Example 1 except that Viton was replaced by AFLAS (trade name, manufactured by Asahi Glass Co., Ltd., a 1,1-difluoroethylene-tetrafluoroethylene-propylene copolymer, [—C$_2$H$_2$F$_2$)a-(C$_2$F$_4$)b-(C$_3$H$_6$)c-], weight Average molecular weight: 110,000, fluorine content: 50mass %).

Then, Evaluations A, B and C for foreign substance-holding power and the evaluation for light resistance (infrared absorption spectrum, GCMS) were performed in the same manner as in Example 1 except that the resulting coating liquid for tacky layers was used.

As a result, fall of standard particles was not observed in Evaluation A for foreign substance-holding power.

In Evaluation B for foreign substance-holding power, the maximum value of the air source pressure at which the movement of standard particles is less than 1 mm was 2.0 kg/cm$^2$G ($1.96 \times 10^{-1}$ MPa) or less. Waviness by air blow was not observed when the air source pressure was 2.0 kg/cm$^2$G ($1.96 \times 10^{-1}$ MPa).

In Evaluation C for foreign substance-holding power, the maximum value of the air source pressure at which the movement of standard particles is less than 1 mm was 1.5 kg/cm$^2$G ($1.47 \times 10^{-1}$ MPa) or less. The waviness by air blow was not observed.

In the infrared absorption spectrum of the tacky layer after irradiated with ArF excimer laser light, neither the formation of a new absorption peak nor the disappearance of an absorption peak was observed, revealing that the tacky layer has light resistance. In the gas chromatography-mass spectrometry, the amount of outgas from the non-irradiated part was 7.1 ppm, while the amount of outgas from the irradiated part was 11.6 ppm at an exposure dose of 500 (J/cm$^2$) and 27.3 ppm at an exposure dose of 1,000 (J/cm$^2$).

Comparative Example 2

Fomblin YHVAC140/13 (trade name, manufactured by Ausimont K.K., perfluoro polyether, CF$_3$—[(O—CF(CF$_3$)—CF$_2$)n-(O—CF$_2$)m]-O—CF$_3$ (where n and m are integers), number average molecular weight: about 7,000, kinetic viscosity at 20° C.: 1,400±200 cSt ($1.4×10^{-3}±0.2×10^{-3}$ m²/s), vapor pressure at 20° C.: $5×10^{-13}$ Torr ($6.67×10^{-11}$ Pa) or less) was prepared. Then, Fomblin YHVAC140/13 was dissolved in perfluoro(2-butenyl tetrahydrofuran), a fluorine solvent, to provide a coating liquid for tacky layers. The content of the fluorine solvent in the resulting coating liquid was set to 20mass %.

Then, Evaluations A and B for foreign substance-holding power were performed in the same manner as in Example 1 except that the resulting coating liquid for tacky layers was used.

As a result, fall of standard particles was observed in Evaluation A for foreign substance-holding power. Moreover, in Evaluation B for foreign substance-holding power, the maximum value of the air source pressure at which the movement of standard particles is less than 1 mm was 0.1 kg/cm²G ($0.981×10^{-2}$ MPa) or less. When the air source pressure was 0.1 kg/cm²G ($0.981×10^{-2}$ MPa), waviness by air blow was also observed.

Comparative Example 3

Teflon (registered trademark) AF1601 (trade name, manufactured by E.I. duPont de Nemours & Co., fluororesin, weight average molecular weight: about 200,000 to 220,000) and Fomblin YHVAC18/8 (trade name, manufactured by Ausimont K.K., perfluoro polyether, $CF_3$—[(O—CF($CF_3$)—$CF_2$)n-(O—$CF_2$)m]-O—$CF_3$ (where n and m are integers), number average molecular weight: about 3,000, kinetic viscosity at 20° C.: 180±20 cSt ($0.18×10^{-3}±0.02×10^{-3}$ m²/s), and vapor pressure at 20° C.: $2×10^{-8}$ Torr ($2.66×10^{-6}$ Pa) or less) were prepared.

First, Teflon (registered trademark) AF1601 (fluororesin) was dissolved in perfluoro(2-butenyl tetrahydrofuran), a fluorine solvent. Next, thereto was further added Fomblin YHVAC18/8 (perfluoro polyether) so as to provide the following compounding ratio, and the resulting mixture was sufficiently stirred and mixed using a stirrer so as to form a uniform solution, thus obtaining a coating liquid for tacky layers. The compounding ratio of Teflon (registered trademark) AF1601 (fluororesin) to Fomblin YHVAC18/8 (perfluoro polyether) was set to 1:3 by mass. The content of the fluorine solvent in the coating liquid for tacky layers was set to 20mass %.

Then, the resulting coating liquid for tacky layers was applied to the inner surface of the pellicle frame made of an aluminum alloy in the same manner as in the evaluation method of foreign substance-holding power in Example 1. Next, the resulting pellicle frame was treated under a condition of 100° C. and 200 mmHg ($2.67×10^4$ Pa) for 1 hour and allowed to stand at room temperature for 1 hour, thus forming a tacky layer having a thickness of 10 μm. Then, Evaluations A and B for foreign substance-holding power were performed in the same trimmer as in Example 1.

As a result, fall of standard particles was observed in Evaluation A for foreign substance-holding power. Moreover, in Evaluation B for foreign substance-holding power, the maximum value of the air source pressure at which the movement of standard particles is less than 1 mm was 1.5 kg/cm²G ($1.47×10^{-1}$ MPa). Moreover, a slight waviness by the air blow was also observed when the air source pressure was 1.5 kg/cm²G ($1.47×10^{-1}$ MPa).

The evaluation results of Example 1 and Comparative Examples 1 to 3 were summarized in Table 1.

TABLE 1

| | | | Example 1 | Comparative Example 1 | Comparative Example 2 |
|---|---|---|---|---|---|
| Resin | Trade name | | Viton-A100 | AFLAS | Fomblin YHVAC140/13 |
| | Structural unit | | —($CH_2CF_2$)— —[$CF_2CF(CF_3$)]— | —($CH_2CF_2$)— —($C_2F_4$)— —($C_3H_3$)— | $CF_3$—[(O—CF($CF_3$)—$CF_2$)n—(O—$CF_2$)m]—O—$CF_3$ |
| | Content of structural unit of Formula (1) (mass %) | | 78 | Unknown | 0 |
| | Fluorine content (mass %) | | 66 | 50 | — |
| | Weight average molecular weight | | 145,000 | 110,000 | — |
| | Number average molecular weight | | — | — | 7000 |
| Foreign substance-holding power | Evaluation A | Fall of standard particles. | No | No | Yes |
| | Evaluation B | Maximum value of source pressure (kg/cm²G) | 3 | 2 | 0.1 |
| | | Waviness | No | No | Yes |
| | Evaluation C | Maximum value of source pressure (kg/cm²G) | 2 | 1.5> | Unmeasured |
| | | Waviness | No | No | Unmeasured |
| Light resistance | Infrared absorption spectrum | 500 J/cm² | No change | No change | Unmeasured |
| | | 1,000 J/cm² | No change | No change | Unmeasured |
| | GCMS | Non-irradiated part @500 J/cm² (ppm) | 2.1 | 7.1 | Unmeasured |
| | | Irradiated part @500 J/cm² (ppm) | 7.1 | 11.6 | Unmeasured |
| | | Irradiated part @1,000 J/cm² (ppm) | 15.1 | 27.3 | Unmeasured |

| | | | Comparative Example 3 |
|---|---|---|---|
| Resin | Trade name | | Teflon AF1601/ Fomblin YHVAC18/8 |
| | Structural unit | | Fluororesin/ $CF_3$—[(O—CF($CF_3$)—$CF_2$)n—(O—$CF_2$)m]—O—$CF_3$ |
| | Content of structural unit of Formula (1) (mass %) | | 0 |
| | Fluorine content (mass %) | | — |

TABLE 1-continued

|  |  |  |  |
|---|---|---|---|
| | | Weight average molecular weight | 200,000 to 220,000 (Teflon AF1601) |
| | | Number average molecular weight | — |
| Foreign substance-holding power | Evaluation A | Fall of standard particles. | Yes |
| | Evaluation B | Maximum value of source pressure (kg/cm$^2$G) | 1.5 |
| | | Waviness | Slight |
| | Evaluation C | Maximum value of source pressure (kg/cm$^2$G) | Unmeasured |
| | | Waviness | Unmeasured |
| Light resistance | Infrared absorption spectrum | 500 J/cm$^2$ | Unmeasured |
| | | 1,000 J/cm$^2$ | Unmeasured |
| | GCMS | Non-irradiated part @500 J/cm$^2$ (ppm) | Unmeasured |
| | | Irradiated part @500 J/cm$^2$ (ppm) | Unmeasured |
| | | Irradiated part @1,000 J/cm$^2$ (ppm) | Unmeasured |

As shown in Table 1, it can be seen that the tacky layer of Example 1 containing a copolymer having a structural unit represented by Formula (1) and a structural unit represented by Formula (2) has satisfactory foreign substance-holding power and high light resistance.

On the other hand, it can be seen that the tacky layer of Comparative Example 1 containing a resin which does not contain a structural unit represented by Formula (2) emits a large amount of outgas as measured by GCMS of the irradiated part and has low light resistance, particularly when the light exposure dose is large. It can also be seen that the tacky layers of Comparative Examples 2 and 3 containing a resin which does not contain a structural unit represented by Formula (1) have low foreign substance-holding power.

This application is entitled to and claims the priority of Japanese Patent Application No. 2012-171829 filed on Aug. 2, 2012, the disclosure of which including the specification, drawings and abstract is herein incorporated by reference in its entirety.

INDUSTRIAL APPLICABILITY

The present invention can provide a pellicle including a tacky layer having holding performance that allows for satisfactory fixation of suspended matter such as dust to the tacky layer, and excellent light resistance to short-wavelength light.

REFERENCE SIGNS LIST 1, 14 Pellicle membrane
3, 12 Pellicle frame
5 Mask
9 Light-blocking pattern
10 Pellicle
16 Adhesive layer
8, 18, 22 Tacky layer
20 Standard particles
24 Air gun
24A Nozzle

The invention claimed is:

1. A pellicle comprising:
a pellicle frame;
a pellicle membrane stretched over one opening of the pellicle frame; and
a tacky layer provided on an inner surface of the pellicle frame,
wherein the tacky layer contains a copolymer having a structural unit represented by Formula (1) and a structural unit represented by Formula (2), in an amount of 60mass % or more with respect to a total weight of the tacky layer $$—CH_2CF_2— \quad (1)$$

$$—CF_2CF(CF_3)— \quad (2).$$

2. The pellicle according to claim 1, wherein a content of the structural unit represented by Formula (1) in the copolymer is 50mass % or more and 85mass % or less with respect to a total mass of the copolymer.

3. The pellicle according to claim 1, wherein a weight average molecular weight of the copolymer is 80,000 or more and 160,000 or less.

4. The pellicle according to claim 1, wherein a fluorine content of the copolymer is 64mass % or more and 71mass % or less with respect to the total mass of the copolymer.

5. The pellicle according to claim 1, wherein the copolymer further contains a structural unit represented by Formula (3)

$$—CF_2CF_2— \quad (3).$$

6. The pellicle according to claim 1, wherein a thickness of the tacky layer is 3 to 20 µm.

* * * * *